United States Patent
Era

(10) Patent No.: US 11,444,172 B2
(45) Date of Patent: Sep. 13, 2022

(54) METHOD FOR PRODUCING SEMICONDUCTOR DEVICE AND SEMICONDUCTOR DEVICE

(71) Applicant: Mitsubishi Electric Corporation, Tokyo (JP)

(72) Inventor: Atsushi Era, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 92 days.

(21) Appl. No.: 16/756,109

(22) PCT Filed: Dec. 1, 2017

(86) PCT No.: PCT/JP2017/043345
§ 371 (c)(1),
(2) Date: Apr. 14, 2020

(87) PCT Pub. No.: WO2019/106843
PCT Pub. Date: Jun. 6, 2019

(65) Prior Publication Data
US 2020/0243668 A1 Jul. 30, 2020

(51) Int. Cl.
*H01L 29/66* (2006.01)
*H01L 21/02* (2006.01)
(Continued)

(52) U.S. Cl.
CPC .... *H01L 29/66462* (2013.01); *H01L 21/0254* (2013.01); *H01L 21/02458* (2013.01);
(Continued)

(58) Field of Classification Search
CPC ........... H01L 21/02458; H01L 21/0254; H01L 29/66462; H01L 29/2003; H01L 29/205; H01L 29/7783
See application file for complete search history.

(56) References Cited

U.S. PATENT DOCUMENTS 7,935,985 B2 * 5/2011 Mishra ................ H01L 29/0891
  257/E29.081
9,024,325 B2 * 5/2015 Miyoshi ................ H01L 29/861
  257/76
(Continued)

FOREIGN PATENT DOCUMENTS

| JP | H09-186363 A | 7/1997 |
| JP | 2012-256704 A | 12/2012 |
| JP | 2014-239159 A | 12/2014 |

OTHER PUBLICATIONS

ISRInternational Search Report; Written Opinion; and Notification of Transmittal of the International Search Report and the Written Opinion of the International Searching Authority, or the Declaration issued in PCT/JP2017/043345; dated Dec. 26, 2017.
(Continued)

*Primary Examiner* — Jay C Kim
(74) *Attorney, Agent, or Firm* — Studebaker & Brackett PC

(57) ABSTRACT

Examples of a method for producing a semiconductor device includes: forming a barrier layer having a composition of InAlN or InAlGaN over a channel layer; forming a transition layer having a composition of InGaN on the barrier layer while raising a growth temperature; and forming a cap layer of GaN on the transition layer.

8 Claims, 4 Drawing Sheets

(51) Int. Cl.
    *H01L 29/20*     (2006.01)
    *H01L 29/205*     (2006.01)
    *H01L 29/778*     (2006.01)

(52) U.S. Cl.
    CPC ........ *H01L 29/2003* (2013.01); *H01L 29/205* (2013.01); *H01L 29/7783* (2013.01)

(56) References Cited

U.S. PATENT DOCUMENTS

| | | | |
|---|---|---|---|
| 9,123,534 B2* | 9/2015 | Yui | H01L 21/0254 257/76 |
| 9,337,278 B1* | 5/2016 | Gu | H01L 24/32 |
| 10,056,252 B2* | 8/2018 | Watanabe | H01L 29/205 |
| 10,062,775 B2* | 8/2018 | Huang | H01L 29/7786 257/22 |
| 10,128,364 B2* | 11/2018 | Hill | H01L 29/7786 |
| 10,263,103 B2* | 4/2019 | Makiyama | 257/24 |
| 10,269,950 B2* | 4/2019 | Yamada | H01L 23/3171 |
| 10,290,713 B2* | 5/2019 | Xie | H01L 29/2003 257/76 |
| 11,101,379 B2* | 8/2021 | Romanczyk | H01L 21/02581 |
| 2009/0272992 A1 | 11/2009 | Tsutsumi et al. | |
| 2010/0270591 A1* | 10/2010 | Ahn | H01L 29/7782 257/194 |
| 2012/0315742 A1 | 12/2012 | Yui et al. | |
| 2013/0207078 A1* | 8/2013 | Laboutin | H01L 21/02507 257/20 |
| 2014/0167058 A1* | 6/2014 | Laboutin | H01L 29/205 438/478 |
| 2014/0361308 A1 | 12/2014 | Yui et al. | |
| 2017/0133217 A1* | 5/2017 | Sato | H01L 29/2003 |
| 2017/0229566 A1* | 8/2017 | Ishiguro | H03F 3/245 |
| 2017/0278961 A1 | 9/2017 | Hill et al. | |

OTHER PUBLICATIONS

An Office Action mailed by the German Patent and Trademark Office dated Feb. 1, 2022, which corresponds to German Application No. 112017008243.9 is related to No. U.S. Appl. No. 16/756,109; with English language translation.

* cited by examiner

METHOD FOR PRODUCING SEMICONDUCTOR DEVICE AND SEMICONDUCTOR DEVICE

FIELD

The present invention relates to a method for producing a semiconductor device and a semiconductor device produced by the method.

BACKGROUND

A group III-V nitride semiconductor film, especially an $Al_xGa_yIn_zN$ (x+y+z=1, y>0) film has a high saturation electron speed and high withstand voltage characteristics and therefore, is applied as a material of electronic devices. Among such electronic devices, a high electron mobility transistor (HEMT), in which highly concentrated two-dimensional electron gas is generated on an interface using a hetero structure, is particularly attracting attention.

A HEMT using an $Al_xGa_yIn_zN$ (x+y+z=1, y>0) film is referred to as a GaN-based HEMT. In the GaN-based HEMT, a barrier layer formed of $Al_xGa_yIn_zN$ (x>0, x+y+z=1) having a larger band gap than that of a channel layer formed of $Al_xGa_yIn_zN$ (x+y+z=1, y>0) may be provided over the channel layer. This causes a highly concentrated 2 DEG to be generated due to a polarization effect, reducing a sheet resistance and thereby allowing a high output to be obtained. GaN is used for the channel layer and AlGaN is used for the barrier layer in many cases.

For achieving high output of GaN-based HEMT, it is effective to use a barrier layer formed of InAlN or InAlGaN instead of AlGaN. By including InN in a mixed crystal, a difference in a lattice constant from the channel layer that is a GaN layer becomes smaller, thereby allowing an increase in a mixed-crystal ratio of AlN. Consequently, the concentration of the two-dimensional electron gas can be improved. When InAlN is used for the barrier layer, a composition such as $In_{0.17}Al_{0.83}N$ is used so as to reduce a lattice mismatch with the GaN channel layer. When such materials exist on an epitaxial wafer surface, the existence of In and the existence of a large amount of Al cause a damage such as surface roughness at the time of annealing or chemical treatment in a wafer process.

Therefore, it is necessary to provide a GaN cap layer on the InAlN barrier layer. However, an optimum growth temperature for the InAlN barrier layer is, for example, about 750° C. and an optimum growth temperature for the GaN cap layer is, for example, about 1050° C.; thus both are significantly different from each other. In rising to the optimum growth temperature for the GaN cap layer, the InAlN barrier layer may be damaged. Conversely, in growing the GaN cap layer without raising the temperature, there is a problem that it is difficult to obtain a high quality GaN cap layer. PTL 1 discloses a method for reducing an impurity concentration in the GaN cap layer without damaging the InAlN barrier layer by separating the GaN cap layer into a low temperature grown layer and a high temperature grown layer.

PRIOR ART

Patent Literature

[PTL 1] JP H9-186363 A

SUMMARY

Technical Problem

In a method disclosed in PTL 1, a low temperature grown GaN layer exists and therefore, the quality of a GaN cap layer is insufficient especially in terms of reduction in C concentration and improvement in flatness. For this reason, there has been a problem that current collapse and gate leakage are large.

The present invention has been made in order to solve the above-mentioned problem and it is an object of the present invention to provide a method for producing a high-quality semiconductor device and the semiconductor device.

Means for Solving the Problems

According to a present invention, a method for producing a semiconductor device includes forming a barrier layer by InAlN or InAlGaN over a channel layer, forming a transition layer by InGaN on the barrier layer while raising a growth temperature, and forming a cap layer by GaN on the transition layer.

According to a present invention, a semiconductor device includes a substrate, a channel layer formed over the substrate, a barrier layer of InAlN or InAlGaN formed over the channel layer, a transition layer of InGaN formed on the barrier layer, a cap layer formed by GaN on the transition layer, wherein a composition of the transition layer is represented by $In_xGa_{1-x}N$ using x, the x being greater than 0 and smaller than 1, the x being a smaller value at a position closer to the cap layer.

Other features will be disclosed below.

Advantageous Effects of Invention

According to the present invention, the transition layer is formed on the barrier layer while raising a growth temperature, and after that, the cap layer is formed on the transition layer; thus allowing a high-quality semiconductor device to be produced.

DESCRIPTION OF EMBODIMENTS

A method for producing a semiconductor device and a semiconductor device according to embodiments of the present invention will now be described with reference to drawings.

Identical or corresponding components are denoted by identical reference signs and repeated descriptions may be omitted.

First Embodiment

Figure 1:
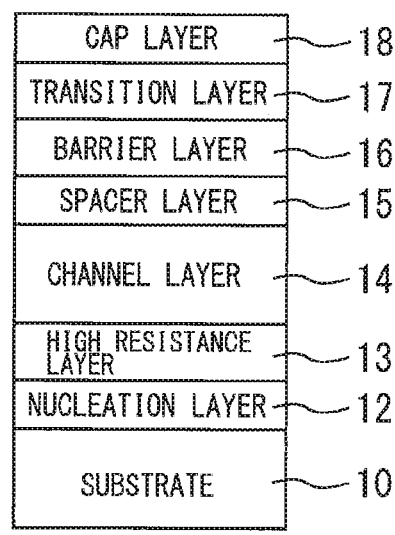
FIG. 1 is a cross-sectional view of a semiconductor device according a first embodiment.

FIG. 1 is a cross-sectional view of a semiconductor device according a first embodiment. The semiconductor device according the first embodiment is a group III-V nitride semiconductor epitaxial wafer. This group III-V nitride semiconductor epitaxial wafer is an epitaxial wafer for producing, for example, a high electron mobility transistor (HEMT).

A method for producing the semiconductor device will be described. First, for example, on a substrate 10 composed of SiC, a nucleation layer 12 is grown by, for example, 50 nm by AlN using a metal organic vapor-phase epitaxy (MOCVD: Metal Organic Chemical Vapor Deposition) method.

Next, on the nucleation layer 12, a high resistance layer 13 is grown by GaN doped with Fe, for example, at $1\times10^{18}$ $cm^{-3}$, by supplying an Fe dopant gas. The thickness of the high resistance layer 13 is, for example, 300 nm. The growth conditions of the high resistance layer 13 are, for example: a temperature of 1050° C.; a pressure of 200 mbar; and using hydrogen as a carrier gas. The high resistance layer 13 is provided in order to improve a withstand voltage and pinch-off characteristics.

Next, a channel layer 14 is grown by undoped GaN on the high resistance layer 13. The thickness of the channel layer 14 is, for example, 1 μm. Its growth conditions are, for example: a temperature of 1100° C.; a pressure of 200 mbar; a V/III ratio of 500; and using hydrogen as a carrier gas. Thus, the channel layer 14 is formed over the substrate 10.

Next, a spacer layer 15 is grown by AlN on the channel layer 14. The thickness of the spacer layer 15 is, for example, 1 nm. Its growth conditions are, for example: a temperature of 1050° C.; a pressure of 70 mbar; a V/III ratio of 2000; and using hydrogen as a carrier gas.

Next, a barrier layer 16 is grown by InAlN on the spacer layer 15. A material for the barrier layer 16 can be InAlN or InAlGaN. The barrier layer 16 functions as an electron supply layer. The thickness of the barrier layer 16 is, for example, 10 nm. Its growth conditions are, for example: a temperature of 750° C.; a pressure of 70 mbar; a V/III ratio of 5000; and using nitrogen as a carrier gas. Thus, the barrier layer 16 of InAlN or InAlGaN is formed over the channel layer 14 via the spacer layer 15.

Next, a transition layer 17 is formed of InGaN on the barrier layer 16. In addition, a cap layer 18 is formed of GaN on the transition layer 17. The thickness of the transition layer 17 is, for example, 2 nm; and the thickness of the cap layer 18 is, for example, 2 nm. The growth conditions of the cap layer 18 are, for example: a temperature of 1050° C.; a pressure of 70 mbar; a V/III ratio of 500; and using hydrogen as a carrier gas. After the cap layer 18 is formed, electrodes are formed on an upper surface side of a wafer and the wafer is diced, thereby allowing a plurality of semiconductor chips to be obtained.

Figure 2:
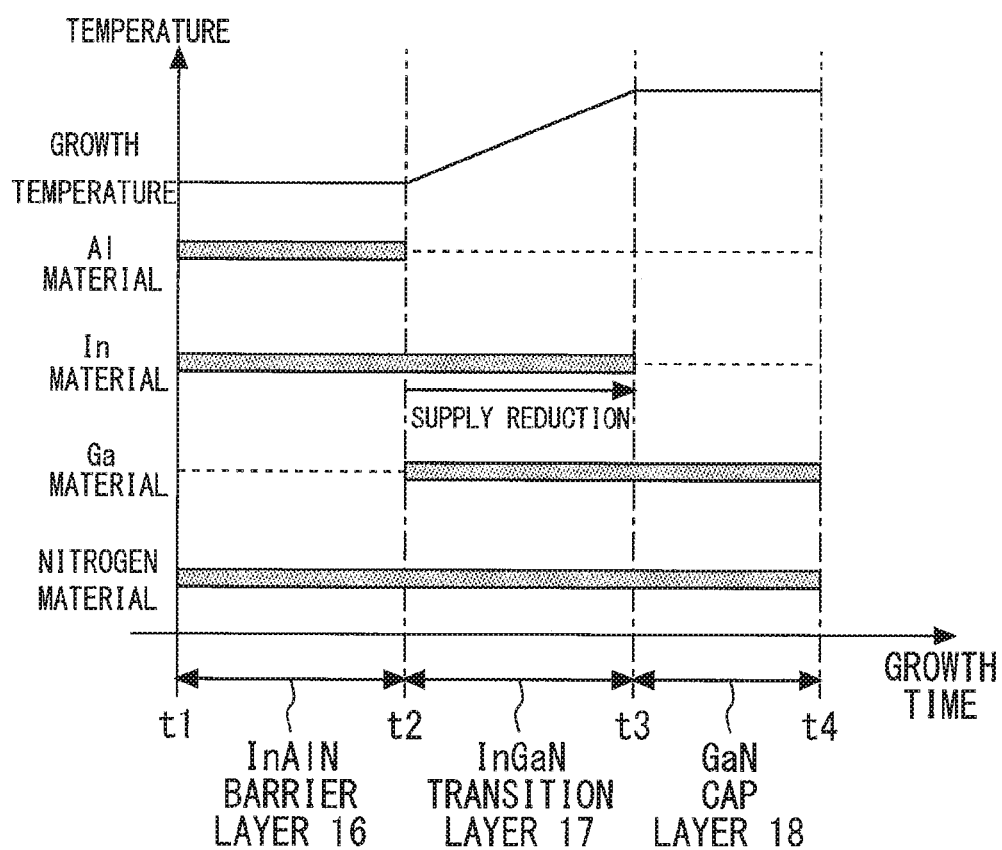
FIG. 2 is a timing chart showing growth conditions of the barrier layer, the transition layer, and the cap layer.

FIG. 2 is a timing chart showing growth conditions of the barrier layer 16, the transition layer 17, and the cap layer 18. FIG. 2 shows a growth temperature, the presence or absence of an Al source material, an in source material, and a Ga source material, and the like in forming each of the layers. Thick lines in the figure represent supplies of material gases and broken lines represent stops of the supplies. During the growth of the barrier layer 16, the transition layer 17, and the cap layer 18, a carrier gas and an N source material are continuously supplied.

During the growth of the transition layer 17, gradual temperature raising from the growth temperature of the barrier layer 16 to the growth temperature of the cap layer 18 is performed. That is, the transition layer 17 is formed of InGaN on the barrier layer 16 while the growth temperature is being raised. In this case, it does not necessarily need to raise the temperature linearly. For example, it may be possible that in a state where the growth temperature of the cap layer 18 is reached by raising the temperature as quickly as possible during the growth of the transition layer 17, InGaN is grown to some degree. Alternatively, the temperature may be raised stepwise during the growth of the transition layer 17. In any case, the growth temperature is raised during the growth of the transition layer 17. By raising the growth temperature during the growth of the transition layer 17, the concentration of In in an upper part of the transition layer 17 can be lowered.

In addition, as shown in FIG. 2, it is preferable to reduce the supply amount of the In source material during the growth of the transition layer 17. By forming the transition layer 17 while reducing the supply amount of the In source material, a part containing a lot of In can be thinned. One method for reducing the supply amount of the In source material can be to linearly reduce the supply amount from the supply amount of the In source material in the growth of the barrier layer 16 to a lower limit supply amount in a supply control device capability. The method for reducing the supply amount of the In source material is not particularly limited; for example, stepwise reduction may be possible or in consideration of reduction in the incorporation amount of In with a temperature rise, the reduction amount may be gradually decreased.

By raising the growth temperature during the growth of the transition layer 17, the incorporation amount of In is reduced. Therefore, the incorporation amount of In to the transition layer 17 can be reduced without reducing the supply amount of the In source material during the growth of the transition layer 17. As one method for significantly reducing the incorporation amount of In, the supply amount of the In source material can be reduced.

In addition, by controlling a temperature rise profile and an In source material supply amount reduction profile during the growth of the transition layer 17, a composition profile in a depth direction of the transition layer 17 can also be adjusted. However, in consideration of the stability and controllability in production, it is preferable that the temperature rise profile and the In source material supply amount reduction profile are linear.

The growth pressure of the transition layer 17 can be, for example, 70 mbar. Since the supply amount of the In source material is reduced during the formation of the transition layer 17, the V/III ratio of the transition layer 17 is not uniform. However, it is preferable that the supply amount of the N source material is also reduced with reduction of the supply amount of the In source material so that the V/III ratio will not become excessively high. That is, the transition layer 17 can be formed while the supply amount of the N source material is reduced. Alternatively, the supply amount of the Ga source material is increased with reduction of the supply amount of the In source material, so that the V/III ratio can be prevented from becoming excessively high. That is, the transition layer 17 can be formed while the supply amount of the Ga source material is increased. These approaches can prevent the effect of improving flatness from being insufficient due to an excessively high V/III ratio. The thickness of the transition layer 17 is required to be more than a thickness that is required for ensuring flatness and to be less than a thickness that causes an adverse effect of lattice mismatching. Specifically, the thickness of the transition layer 17 is preferable to be 0.5 nm or more and 3 nm or less.

Figure 3:
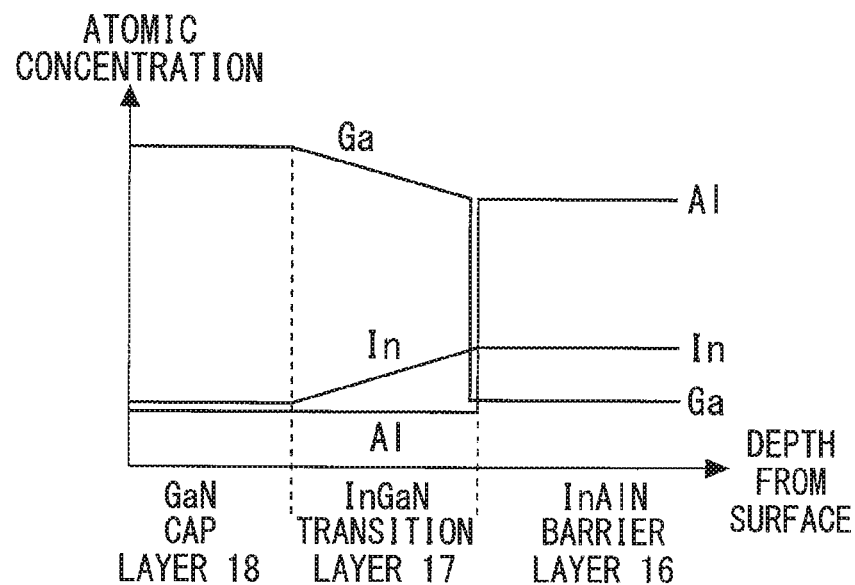
FIG. 3 is a view showing an atomic concentration profile.

Through the above-mentioned process, the group III-V nitride semiconductor epitaxial wafer is produced. FIG. 3 is a view showing an atomic concentration profile of In, Al, and Ga in the barrier layer 16, transition layer 17, and cap layer 18 of the group nitride semiconductor epitaxial wafer produced by the method for producing a semiconductor device of the first embodiment. The composition of the transition layer 17 is represented by $In_xGa_{1-x}N$ using x that is greater than 0 and smaller than 1. The x in this expression can be found to be a smaller value at a position closer to the cap layer 18. It should be noted that In FIG. 3, lines are drawn so as not to be overlapped with one another for convenience.

In the method for producing a semiconductor device according to the first embodiment, In is made to function as a surfactant, thereby allowing planarization of a film to be achieved. Therefore, although an initial stage of the growth of the transition layer 17 is a low temperature growth, it is possible to grow flat. During the formation of the transition layer 17, the temperature is raised while using the surfactant effect of In, thereby allowing the flatness of the transition layer 17 to be secured. The secured flatness provides an effect of reducing a gate leakage.

Figure 4:
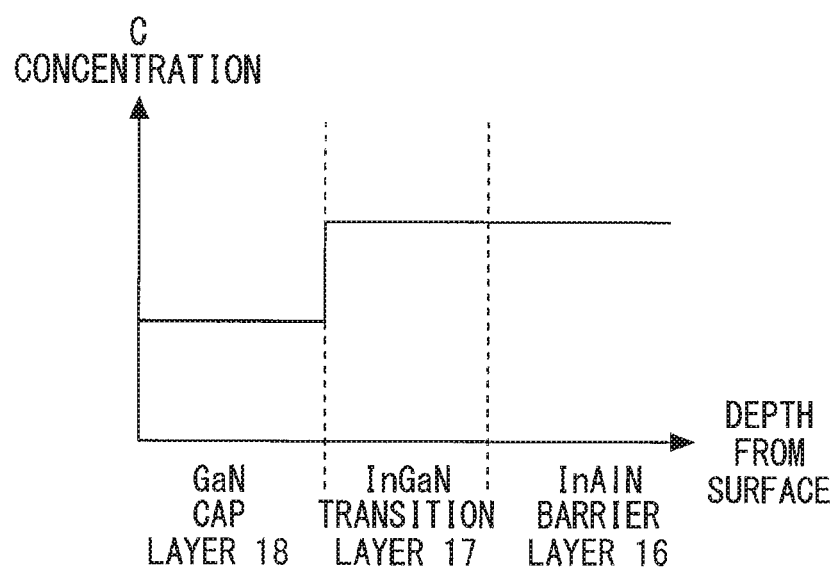
FIG. 4 is a view showing example of a C concentration profile.
Figure 5:
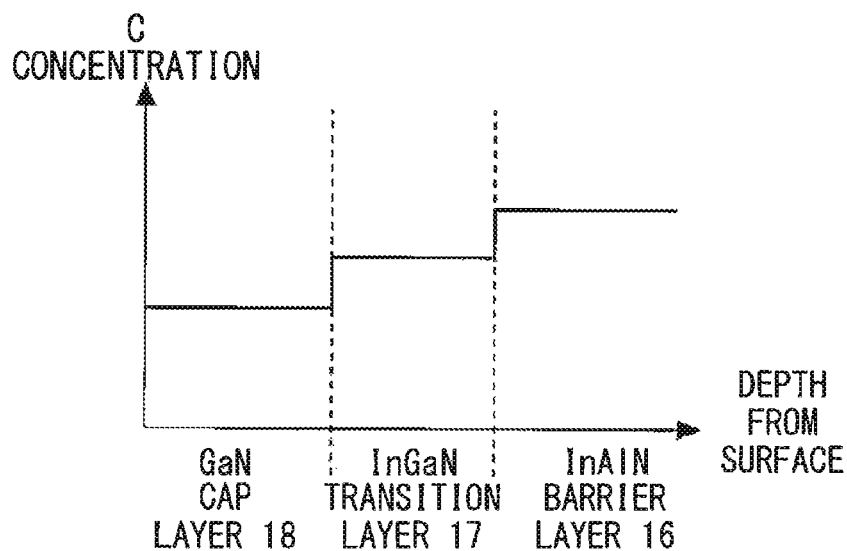
FIG. 5 is a view showing another example of a C concentration profile.

FIGS. 4 and 5 are views showing examples of a C concentration profile for the barrier layer 16, transition layer 17, and cap layer 18 of the semiconductor device of the first embodiment. In FIGS. 4 and 5, the C concentration in the cap layer 18 is lower than the C concentration in the barrier layer 16. In addition, in FIG. 5, the C concentration in the transition layer 17 is lower than the C concentration in the barrier layer 16. In FIGS. 4 and 5, the C concentration in the cap layer 18 is lower than the C concentration in the transition layer 17. Both the lower C concentration in the cap layer 18 than the C concentration in the barrier layer 16 and the lower C concentration in the transition layer 17 than the C concentration in the barrier layer 16 cause the C concentration in the cap layer 18 to be lowered, thereby contributing to preventing current collapse. The above-mentioned effect can be obtained even when only either the lower C concentration in the cap layer 18 than the C concentration in the barrier layer 16 or the lower C concentration in the transition layer 17 than the C concentration in the barrier layer 16 is achieved; however, it is preferable that the both are achieved.

The C concentration profile does not necessarily need to be as shown in FIGS. 4 and 5. The above effect can be obtained irrespective of the relationship of C concentration levels of the transition layer 17 and the cap layer 18. However, when the method for producing a semiconductor device according to the first embodiment is used, the C concentration in the cap layer 18 is normally lower than the C concentration in the transition layer 17. This is because the growth temperature of the cap layer 18 is higher than the growth temperature of the transition layer 17.

By growing the cap layer 18 at a high temperature, the C concentration in the cap layer 18 can be made lower than the C concentration in the barrier layer 16. In addition, the transition layer 17 grows while the temperature is raised and therefore, the C concentration in the transition layer 17 can be made lower than the C concentration in the barrier layer 16. This prevents current collapse. For preventing current collapse, it is important to reduce the C concentration in a layer that is on a front surface side relative to the barrier layer 16 and is composed of a material having a small band gap.

The transition layer 17 is grown while the temperature is raised and therefore, the C concentration in the cap layer 18 formed of GaN basically becomes lower than the C concentration in the transition layer 17 formed of InGaN. However, depending on the setting of the V/III ratio, the C concentration in the cap layer can be made higher than that in the transition layer while using the method for producing a semiconductor device according to this embodiment and a second embodiment.

It is not a required configuration that the C concentration in the cap layer is lower than the C concentration in the transition layer. In addition, the C concentration in the transition layer 17 is not necessary to be constant; for example, it may become lower toward a front surface side. In the method for producing a semiconductor device according to the first embodiment, the growth temperature of the transition layer 17 is raised and therefore, the C concentration in the transition layer 17 becomes lower toward the front surface side in many cases.

The method for producing a semiconductor device and the semiconductor device according to the first embodiment may be variously modified within a range not losing the characteristics thereof. For example, the substrate 10 is not limited to SiC and may also be Si or sapphire. The nucleation layer 12 formed of AlN is one example of a buffer layer for growing a GaN layer on its upper part. As the nucleation layer 12, another $Al_xGa_yIn_zN$ (x+y+z=1) may be used; or a multilayer buffer layer in which $Al_xGa_yIn_zN$ (x+y+z=1) layers of a plurality of compositions are laminated may be used. For example, after a material such as SiN is provided on a substrate, $Al_xGa_yIn_zN$ (x+y+z=1) may be grown.

The high resistance layer 13 has been described as being of Fe doped GaN; however, C doped GaN may be used as the high resistance layer or the high resistance layer itself does not have to be provided. A material for the barrier layer 16 can be InAlN or InAlGaN. When InAlGaN is used, Ga is supplied in a period of forming the barrier layer 16 in FIG. 2.

In FIG. 1, the barrier layer 16, the transition layer 17, and the cap layer 18 are continuously grown; however, they do not necessarily have to be continuously grown. A growth interruption period may be provided in order to improve steepness of an interface, to transition to a growth condition for each layer, to stabilize a gas flow after switching of a carrier gas, and the like.

As the Al source material, the Ga source material, and the N source material, for example, trimethylaluminum, trimethylgallium, and ammonia can be used, respectively. In addition, it is preferable that when the barrier layer 16 of InAlN is grown, nitrogen is used as a carrier gas and when layers other than the barrier layer 16 are grown, hydrogen is used as a carrier gas. However, source materials or carrier gas other than those may be used. Further, structures and growth conditions which are not related to the characteristics of the method for producing a semiconductor device and the semiconductor device in the first embodiment do not have to be those described above.

The growth pressure of the barrier layer 16 is preferable to be 100 mbar or lower. This is because when the growth pressure is raised higher than 100 mbar, the Al source material reacts in a vapor phase and normal growth cannot be achieved. On the other hand, if the growth pressure is lowered too much, the incorporation amount at a C concentration becomes too much and therefore, the growth pressure of the barrier layer 16 is preferable to be 25 mbar or higher.

Second Embodiment

Figure 6:
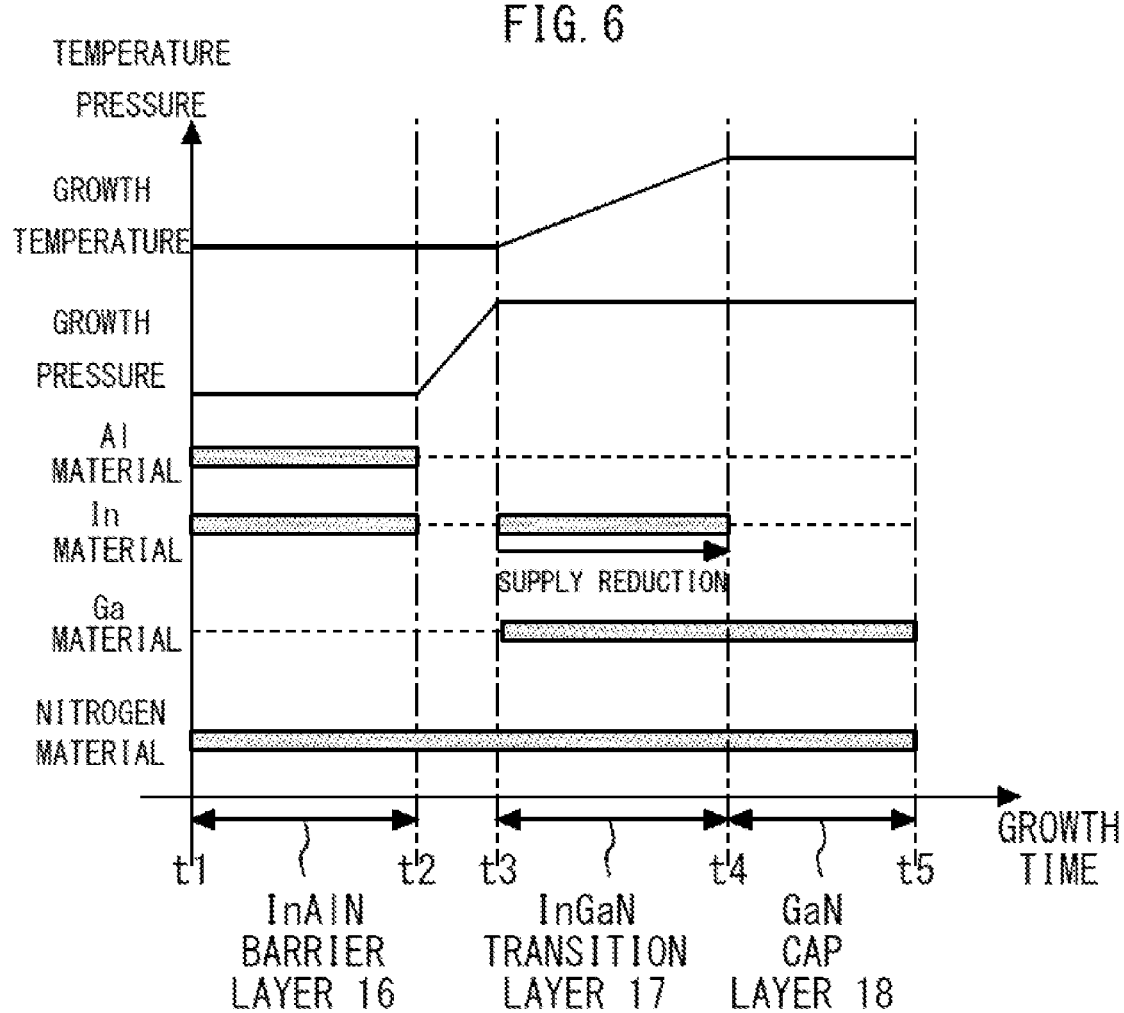
FIG. 6 is a timing chart showing a sequence for forming each layer according to the second embodiment.

A method for producing a semiconductor device and a semiconductor device according to a second embodiment have a lot in common with the first embodiment and therefore, differences from the first embodiment will be mainly described. FIG. 6 is a timing chart showing a sequence from the formation of a barrier layer 16 to the formation of a cap layer 18 according to the second embodiment. After the barrier layer 16 is grown, a furnace pressure is increased and then, a transition layer 17 is formed. A period from time t2 to time t3 after the growth of the barrier layer 16 is a growth interruption period. During this growth interruption period, the furnace pressure is raised so that the growth pressures in the growth of the transition layer 17 and the growth of the cap layer 18 are higher than the growth pressure in the growth of the barrier layer 16. That is, the furnace pressure is increased.

By making the growth pressures of the transition layer 17 and the cap layer 18 higher than the growth pressure of the barrier layer 16, the C concentrations of the transition layer 17 and the cap layer 18 can be further reduced than those in the first embodiment. The pressure can be raised because InGaN is used for the transition layer 17. If a material containing Al, such as InAlGaN, is used for the transition layer 17, an Al source material reacts in a vapor phase and normal growth cannot be achieved. Thus, the inventor has found an optimal structure and production method to solve a lot of problems that can be obstacles to preventing gate leakage and current collapse.

The growth pressures in the growth of the transition layer 17 and in the growth of the cap layer 18 are preferable to be 150 mbar or higher. This enables the C concentration to be sufficiently lowered so as not to cause current collapse. On the other hand, if the growth pressure is raised too much, a vapor reaction occurs even without using an Al source material and normal growth cannot be achieved. Therefore, the growth pressures in the growth of the transition layer 17 and in the growth of the cap layer 18 are preferable to be 400 mbar or less.

In order to sufficiently prevent current collapse, the C concentration in the cap layer 18 is preferable to be $5 \times 10^{16}$ [cm$^{-3}$] or lower and the C concentration in the transition layer 17 is preferable to be $1 \times 10^{17}$ [cm$^{-3}$] or lower. Even after the transition layer 17 is grown, a growth interruption period may be provided. In addition, as with the first embodiment, structures or growth conditions which are not related to the effects of the present invention do not have to be as described in the embodiment.

Figure 7:
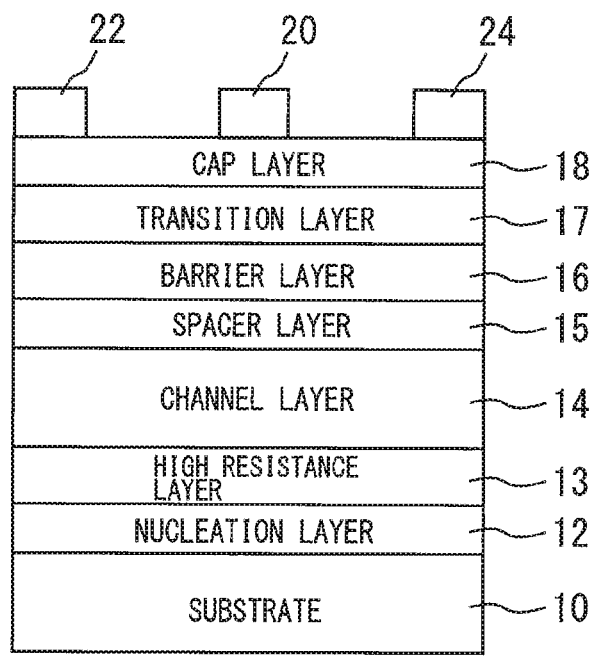
FIG. 7 is a cross-sectional view of a semiconductor device.

FIG. 7 is a cross-sectional view of a semiconductor device in which electrodes are formed on a wafer formed by the method of the first embodiment or the second embodiment. On the cap layer 18, a gate electrode 20, a source electrode 22, and a drain electrode 24 are provided. A band gap of the barrier layer 16 is larger than a band gap of the channel layer 14; and by applying a voltage to the electrodes, two-dimensional electron gas is generated on the channel layer 14. This allows a high electron mobility transistor to be configured.

DESCRIPTION OF SYMBOLS 16 barrier layer, 17 transition layer, 18 cap layer

The invention claimed is:

1. A semiconductor device, comprising:
a substrate;
a channel layer formed over the substrate;
a barrier layer of InAlN or InAlGaN formed over the channel layer;
a transition layer of InGaN formed on the barrier layer;
a cap layer formed by GaN on the transition layer; wherein
a composition of the transition layer is represented by $In_xGa_{1-x}N$, and
the value of x is greater than 0 and smaller than 1 and the value of x decreases in a direction from the barrier layer to the cap layer.

2. The semiconductor device according to claim 1, wherein
a C concentration in the cap layer is lower than a C concentration in the barrier layer.

3. The semiconductor device according to claim 1, wherein
a C concentration in the transition layer is lower than a C concentration in the barrier layer.

4. The semiconductor device according to claim 2, wherein
a C concentration in the cap layer is lower than a C concentration in the transition layer.

5. The semiconductor device according to claim 1, wherein
a C concentration in the cap layer is $5 \times 10^{16}$[cm$^{-3}$] or lower.

6. The semiconductor device according to claim 1, wherein
a C concentration in the transition layer is $1 \times 10^{17}$[cm$^{-3}$] or lower.

7. The semiconductor device according to claim 1, wherein
a film thickness of the transition layer is 0.5 nm or more and 3 nm or less.

8. The semiconductor device according to claim 1, comprising:
a gate electrode provided on the cap layer;
a source electrode provided on the cap layer; and
a drain electrode provided on the cap layer; wherein
a band gap of the barrier layer is larger than a band gap of the channel layer;
thus constituting a high electron mobility transistor.

* * * * *